(12) United States Patent
Ehlen et al.

(10) Patent No.: US 9,807,901 B2
(45) Date of Patent: Oct. 31, 2017

(54) MULTIPLE GRAPHICS PROCESSING UNIT PLATFORM

(71) Applicant: Facebook, Inc., Menlo Park, CA (US)

(72) Inventors: John Brian Ehlen, Newark, CA (US); Yan Zhao, Cupertino, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/258,929

(22) Filed: Sep. 7, 2016

(65) Prior Publication Data

US 2016/0381825 A1    Dec. 29, 2016

Related U.S. Application Data

(63) Continuation-in-part of application No. 15/063,024, filed on Mar. 7, 2016.

(60) Provisional application No. 62/129,592, filed on Mar. 6, 2015.

(51) Int. Cl.
  *H05K 7/20* (2006.01)
  *H05K 7/14* (2006.01)

(52) U.S. Cl.
  CPC ....... *H05K 7/1487* (2013.01); *H05K 7/20727* (2013.01)

(58) Field of Classification Search
  CPC .. H05K 7/1467; H05K 7/1487; H05K 7/1488; H05K 7/1489
  See application file for complete search history.

(56) References Cited

U.S. PATENT DOCUMENTS

| 3,853,379 | A | | 12/1974 | Goodman et al. |
| 4,256,356 | A | | 3/1981 | Roth et al. |
| 5,214,567 | A | * | 5/1993 | Feightner ............... G06F 1/181 |
| | | | | 361/679.32 |
| 5,302,133 | A | | 4/1994 | Tondreault |
| 5,848,906 | A | | 12/1998 | Glusker et al. |
| 6,459,571 | B1 | * | 10/2002 | Carteau ................. G06F 1/184 |
| | | | | 312/35 |
| 6,625,035 | B1 | | 9/2003 | Steinman et al. |
| 6,685,489 | B1 | | 2/2004 | Rubenstein et al. |
| 7,375,923 | B2 | | 5/2008 | DeCenzo et al. |

(Continued)

OTHER PUBLICATIONS

Non-Final Office Action dated Apr. 28, 2017, for U.S. Appl. No. 15/063,024 of Li, H. et al., filed Mar. 7, 2016.

(Continued)

*Primary Examiner* — Anthony Q Edwards
(74) *Attorney, Agent, or Firm* — Perkins Coie LLP

(57) ABSTRACT

A multiple graphics processing unit (multi-GPU) platform including a cubby chassis and at least one multi-GPU sled. The cubby chassis includes partitions defining a plurality of sled positions. The multi-GPU sled includes a chassis having a vertical sidewall and a horizontal bottom wall with an open top and an open side. A side-plane PCB is mounted to the vertical sidewall and a plurality of dividers are attached to the bottom wall and oriented perpendicular to the side-plane PCB. One or more GPU cards are connected to the side-plane PCB and are supported on the plurality of dividers. The GPU cards include a GPU PCB having a first side facing the bottom wall and an outward facing second side. A cover is coupled to the horizontal bottom wall to enclose the open side of the sled chassis and help direct airflow across the GPU cards.

18 Claims, 11 Drawing Sheets

(56) References Cited

U.S. PATENT DOCUMENTS

| | | | |
|---|---|---|---|
| 7,583,507 B2 | 9/2009 | Starr et al. | |
| 7,864,519 B2 * | 1/2011 | Lin | G11B 33/128 361/679.33 |
| 9,532,480 B2 * | 12/2016 | Shen | H05K 7/1487 |
| 9,538,683 B2 | 1/2017 | Ehlen et al. | |
| 2001/0043432 A1 | 11/2001 | Hamatsu et al. | |
| 2004/0264146 A1 | 12/2004 | Kerrigan et al. | |
| 2007/0247804 A1 | 10/2007 | Li et al. | |
| 2013/0050955 A1 | 2/2013 | Shinsato et al. | |
| 2014/0203696 A1 * | 7/2014 | Rust | G11B 33/02 312/330.1 |
| 2014/0204537 A1 | 7/2014 | Rust et al. | |
| 2014/0265794 A1 | 9/2014 | Schroeder et al. | |
| 2015/0208543 A1 * | 7/2015 | Chen | H05K 7/1489 361/679.39 |
| 2015/0359125 A1 | 12/2015 | Ehlen et al. | |
| 2016/0261083 A1 | 9/2016 | Chu et al. | |
| 2016/0262282 A1 | 9/2016 | Li et al. | |
| 2016/0381824 A1 * | 12/2016 | Chu | H05K 7/1487 361/679.32 |

OTHER PUBLICATIONS

Restriction Requirement dated Mar. 14, 2017 for U.S. Appl. No. 14/704,166 of Chu, R., et al., filed May 5, 2015.
Final Office Action dated Apr. 20, 2016, for U.S. Appl. No. 14/300,821 of Ehlen, J. et al., filed Jun. 10, 2014.
Non-Final Office Action dated Oct. 6, 2015, for U.S. Appl. No. 14/300,821 of Ehlen, J., et al. filed Jun. 10, 2014.
U.S. Appl. No. 14/300,821 of Chu, R. filed May 5, 2015.
U.S. Appl. No. 14/704,166 of Chu, R., filed May 5, 2015.
U.S. Appl. No. 15/063,024 by Li, H. et al., filed Mar. 7, 2016.
Non-Final Office Action dated Jun. 15, 2017 for U.S. Appl. No. 14/704,166 of Chu, R., et al., filed May 5, 2015.
Notice of Allowance dated Aug. 14, 2017 for U.S. Appl. No. 15/063,024 of Li, H. et al., filed Mar. 7, 2016.

* cited by examiner

US 9,807,901 B2

MULTIPLE GRAPHICS PROCESSING UNIT PLATFORM

CROSS-REFERENCE TO RELATED APPLICATIONS

This application is a continuation-in-part of U.S. Non-Provisional application Ser. No. 15/063,024, filed Mar. 7, 2016, which claims priority to and the benefit of U.S. Provisional Application No. 62/129,592, filed Mar. 6, 2015, the disclosures of which are hereby incorporated by reference in their entireties.

TECHNICAL FIELD

This patent application is directed to a multiple graphics processing unit platform with a modular chassis configuration.

BACKGROUND

Existing server platforms generally include a single printed circuit board (PCB) with multiple servers. Thus, if one server fails, the entire PCB must be replaced. In addition, the server density is not always maximized for a given form factor. Similarly, conventional graphics processing unit (GPU) cards are typically very large which limits their density for a given form factor. Therefore, there is a need for easily serviceable server and GPU platforms that use space efficiently and maximizes the performance of the servers and GPUs.

BRIEF DESCRIPTION OF THE DRAWINGS

The disaggregated device slide for parallel graphics processing introduced here may be better understood by referring to the following Detailed Description in conjunction with the accompanying drawings and appendices, all of which are incorporated herein and constitute a part of this specification.

Figure 1:
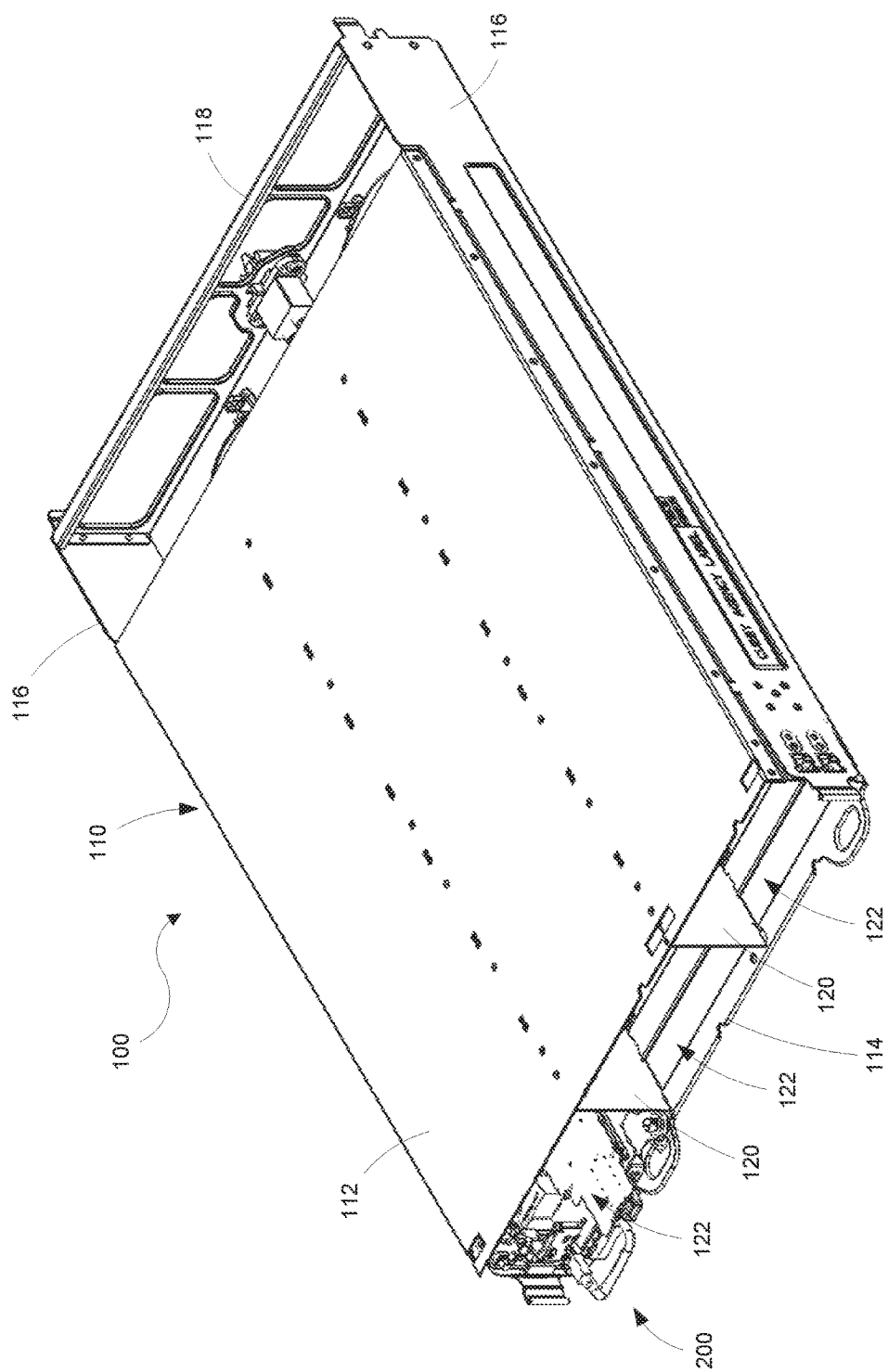
FIG. 1 is an isometric view of a multi-node server platform with a cubby chassis according to a representative embodiment.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of this disclosure.

DETAILED DESCRIPTION

Overview

A multi-node server platform is disclosed that includes a modular chassis design including a cubby chassis housing multiple multi-server sleds. Each sled includes multiple modular server cards. In some embodiments, the platform has an agnostic architecture facilitated by an integrated circuit that performs a "bridging function" between each server's central processing unit (CPU) and a single 10G communication connector located on the front of each sled.

Each sled houses multiple server cards (e.g., four servers) in a form factor that allows three sleds to be mounted side-by-side in a corresponding cubby. The sled includes a sturdy chassis supporting a vertically oriented side plane PCB. The server cards are inserted horizontally into the side plane PCB and are supported by edge guides disposed on dividers mounted to the chassis. In some embodiments, the dividers are plastic and include large air flow openings. The server cards are mounted in the sled such that the components (e.g., memory and heat sink) extend downward into the sled, the server card encloses the top of the chassis for proper airflow, and the server connectors are positioned closer to the sled's network connection for improved signal integrity. The sled also includes air duct covers to enclose the side of the chassis and direct the airflow through the sled. The cubby chassis provides power to each sled by a single floating bus bar connector that splits the power connections into three sets, each of which connects to a corresponding sled.

In an embodiment, the multi-node server platform includes a cubby chassis and at least one multi-server sled. The cubby chassis includes one or more partitions defining a plurality of sled positions. The multi-server sled is located in a corresponding one of the plurality of sled positions. The multi-server sled includes a sled chassis having a vertical sidewall and a horizontal bottom wall, wherein the sled chassis has an open top and an open side opposite the vertical sidewall. A vertically oriented side-plane PCB is mounted to the vertical sidewall and a plurality of dividers are attached to the bottom wall and are oriented substantially perpendicular to the side-plane PCB. One or more server cards are connected to the side-plane PCB and are horizontally supported by a pair of the plurality of dividers. The server cards include a server PCB having a first side facing the bottom wall and an outward facing second side enclosing the open top of the sled chassis with server components coupled to the first side of the server PCB. A cover is coupled to the horizontal bottom wall to enclose the open side of the sled chassis and help direct airflow across the server cards.

A multi-GPU sled is disclosed. Each sled houses multiple graphics processing units (multi-GPU) cards (e.g., four GPUs) in a PCI form factor that allows three sleds to be mounted side-by-side in a corresponding cubby. A mini-server manages the GPUs and interfaces with a network interface card. The sled includes a sheet metal chassis supporting a vertically oriented sideplane PCB. The GPU cards are inserted horizontally into the sideplane PCB and are supported on by edge guides disposed on dividers mounted to the chassis. In some embodiments, the sled also includes an air duct cover to enclose the side of the chassis and direct the airflow through the sled.

Although the platform may be described herein with respect to selected multiples of components, sleds, server modules, graphical processor units, and cubby positions, for example, it should be understood that other multiples may be implemented.

General Description

Various examples of the devices introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

As shown in FIG. 1, the multi-node server platform 100 includes a cubby chassis 110 configured to mount into a component rack (not shown) and house one or more multi-server sleds 200. The illustrated cubby chassis 110 can be a sheet metal chassis, and it includes three sled positions 122 sized and configured to receive a multi-server sled 200 in each position. The cubby chassis 110 of other embodiments can have a greater or fewer number of sled positions 122. The cubby chassis 110 includes top and bottom panels 112 and 114, respectively, spaced apart by sidewalls 116, and end wall 118. A pair of partitions 120 are positioned between the top and bottom panels (112, 114) to divide the cubby chassis 110 into the three sled positions 122.

Figure 2:
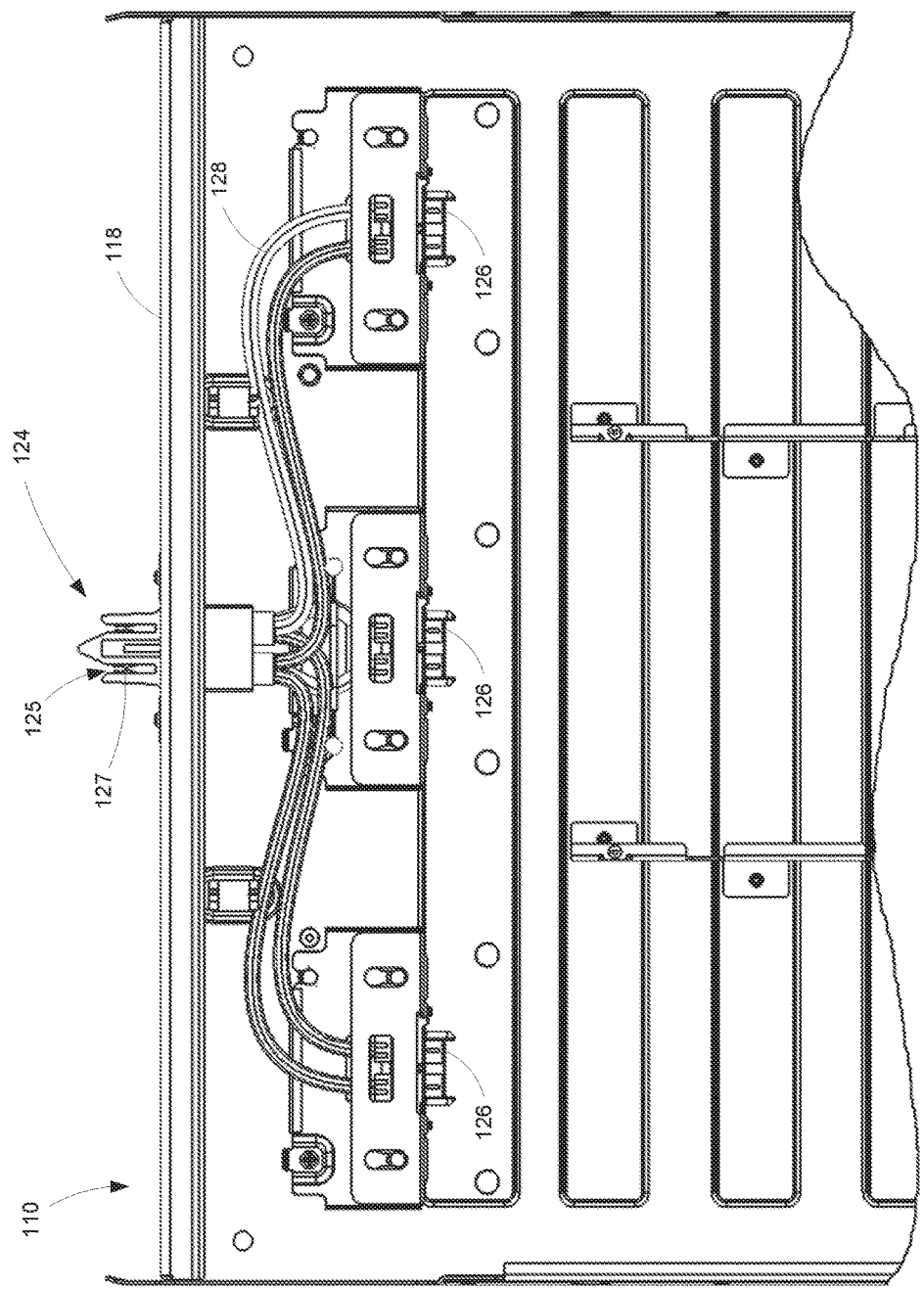
FIG. 2 is a partial, enlarged top plan view of the cubby chassis shown in FIG. 1 with the top panel removed for clarity.
Figure 3:
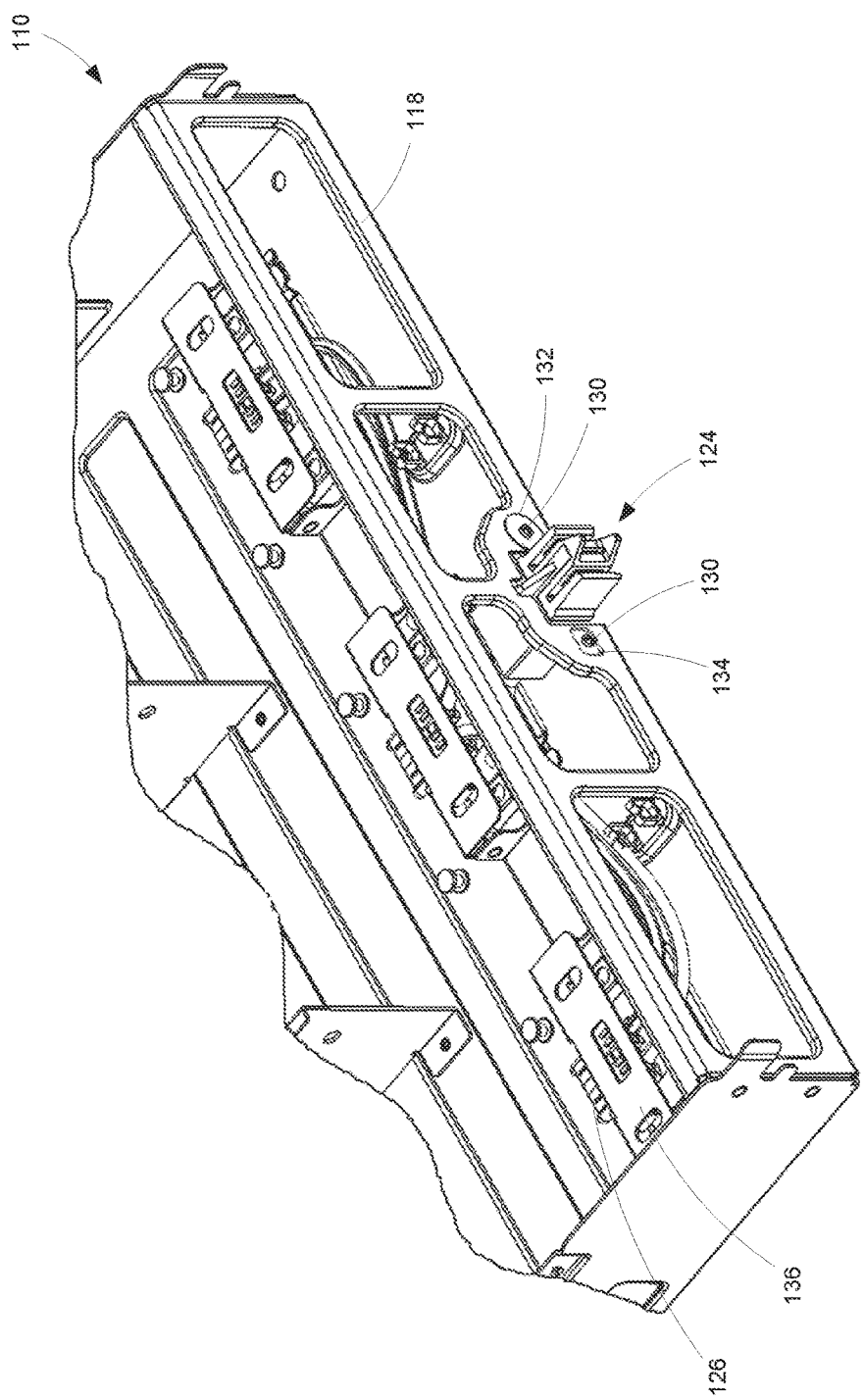
FIG. 3 is a partial isometric view of the cubby chassis as viewed from the rear.

With further reference to FIG. 2, the cubby chassis 110 includes a power input connector 124 attached to the end wall 118 of the cubby chassis 110. In some embodiments, the power input connector 124 includes a pair of slots 125 containing contacts 127 that engage or clip onto a corresponding power bus bar (not shown). The power input connector 124 is connected to three cubby connectors 126 via a power cable assembly 128. As shown in FIG. 3, the power input connector 124 is attached to the cubby chassis end wall 118 with fasteners 130 and washers 132 (left washer not shown). The end wall 118 includes mounting apertures 134 that are enlarged with respect to the fasteners 130. Accordingly, the power input connector 124 floats in the end wall 118 to compensate for any misalignment between the cubby chassis 110 and the component rack power bus bars. The cubby connectors 126 are similarly mounted in connector brackets 136 to compensate for any misalignment between the multi-server sleds 200 (FIG. 1) and the cubby chassis 110.

Figure 4:
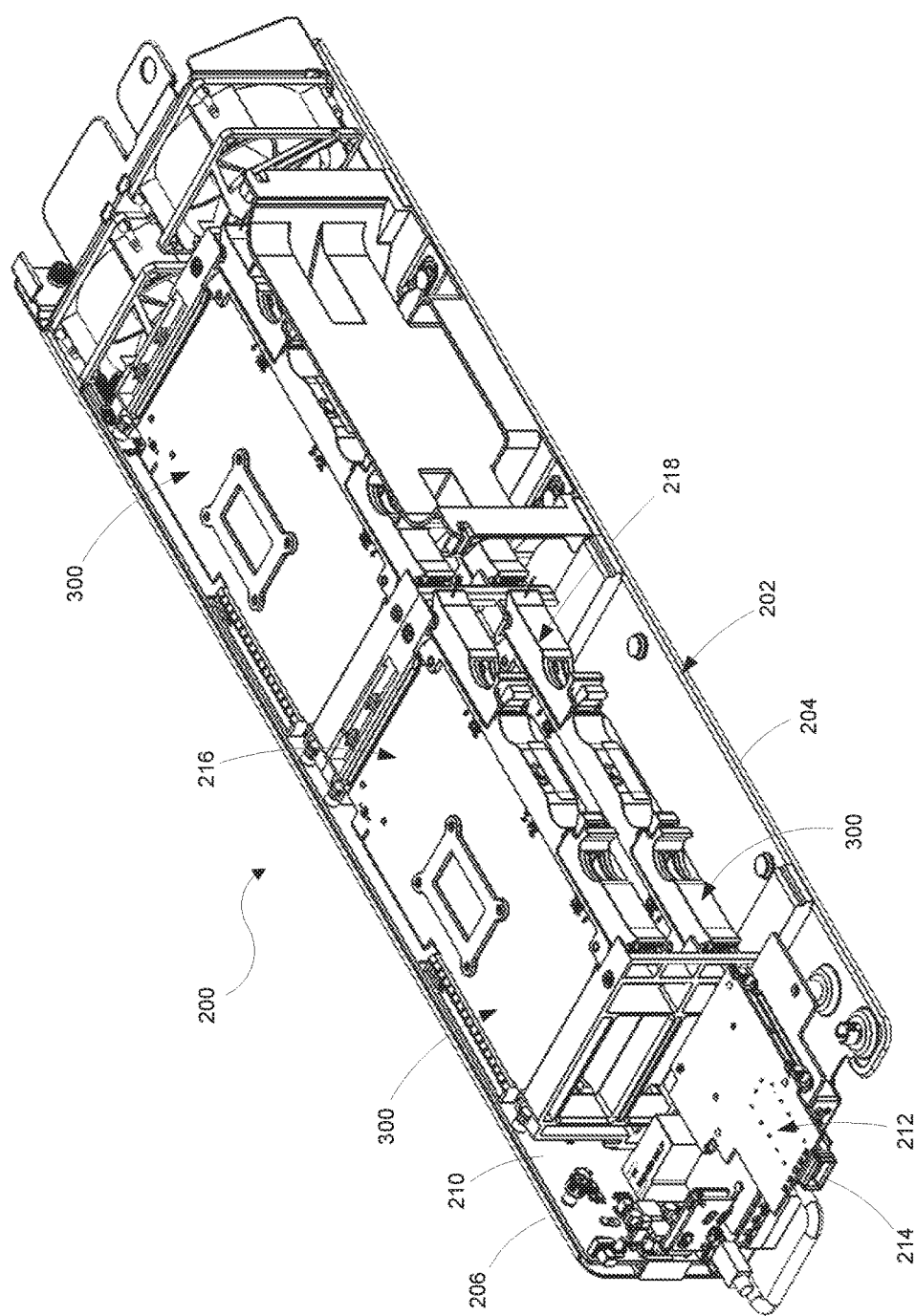
FIG. 4 is an isometric view of a multi-server sled according to a representative embodiment.

As shown in FIG. 4, each multi-server sled 200 of the illustrated embodiment can house up to four server cards 300. The multi-server sled 200 includes a sheet metal sled chassis 202 supporting a vertically oriented side plane PCB 210. The server cards 300 are inserted horizontally into the multi-server sled 200 for operative engagement with the side plane PCB 210 via conventional connectors. The illustrated sled chassis 202 has a vertical sidewall 206 and a horizontal bottom wall 204, wherein the sled chassis has an open top 216 and an open side 218 opposite the vertical sidewall 206. Each server card 300 is connected via the side plane PCB 210 to a mezzanine card 212 that includes a single 10G network connection 214 located on the front of the multi-server sled 200.

Figure 5:
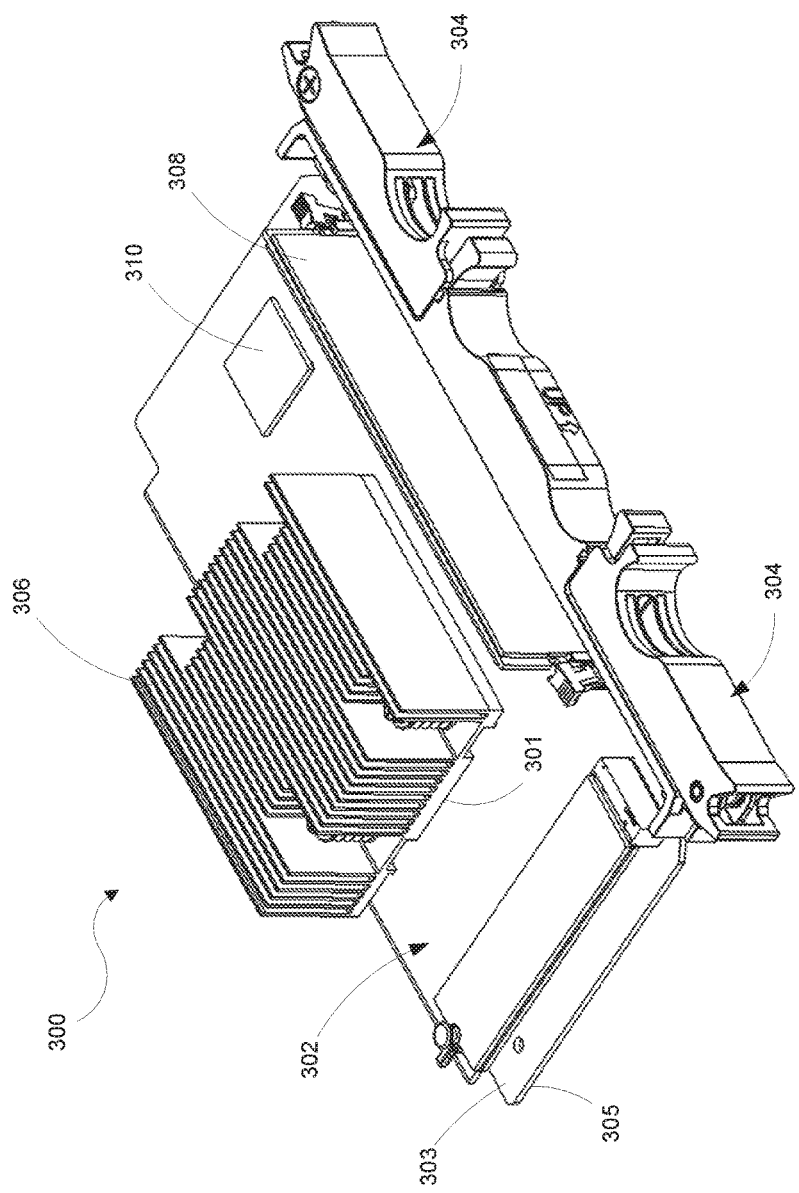
FIG. 5 is an isometric view of a representative server card as viewed from underneath.

As shown in FIG. 5, each server card 300 includes a server PCB 302 and a pair of latches 304. The server PCB 302 has a first side 303 and second side 305. The first side 303 of the server PCB 302 supports a CPU 301 and corresponding heat sink 306, as well as memory 308 and a bridge integrated circuit (IC) 310. Each server card 300 has an agnostic architecture facilitated by the bridge IC 310 that performs a "bridging function" between each server's CPU 301 and the mezzanine card 212 (FIG. 4).

Figure 6:
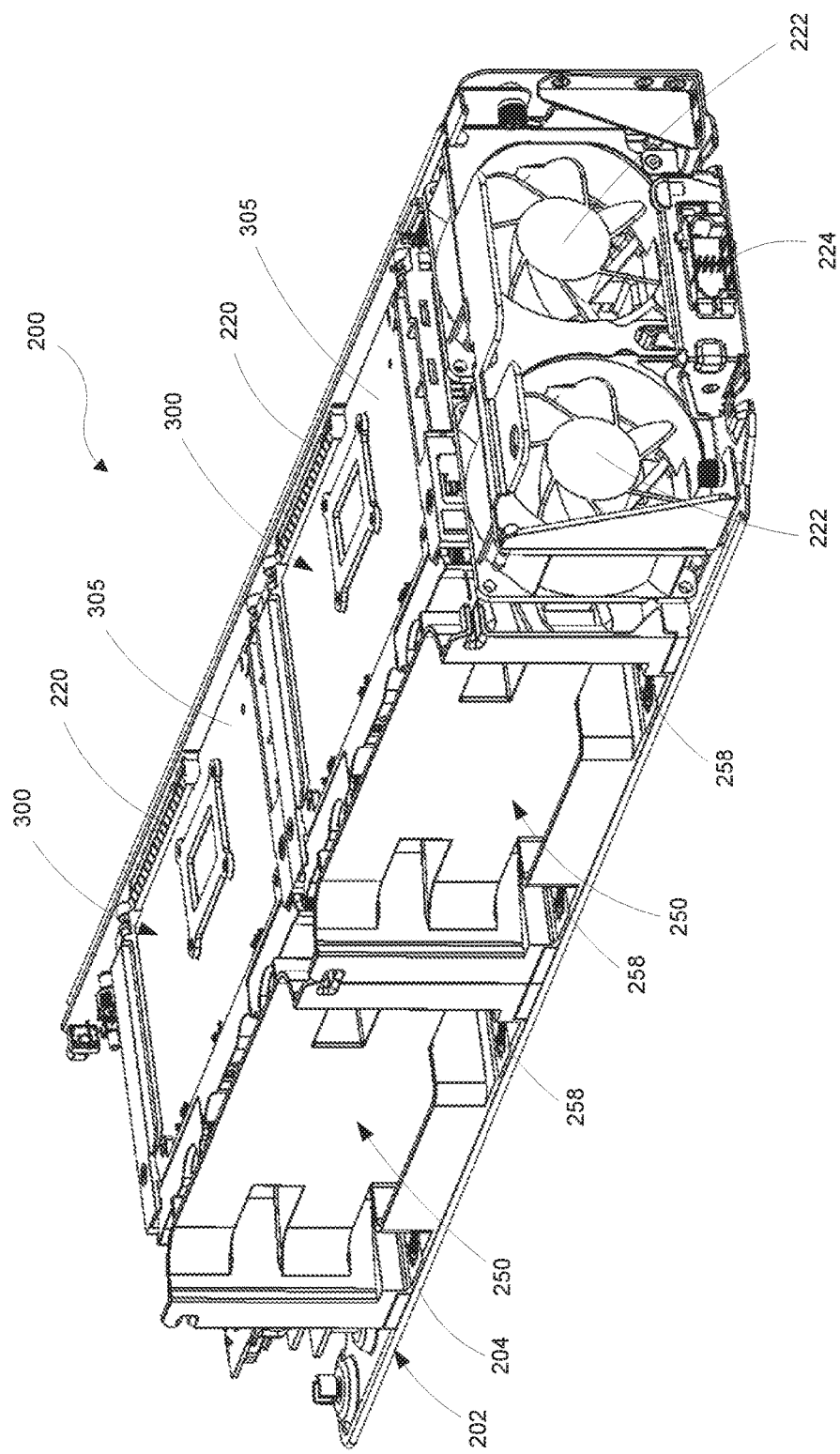
FIG. 6 is an isometric view of the sled shown in FIG. 4 as viewed from the rear.
Figure 7:
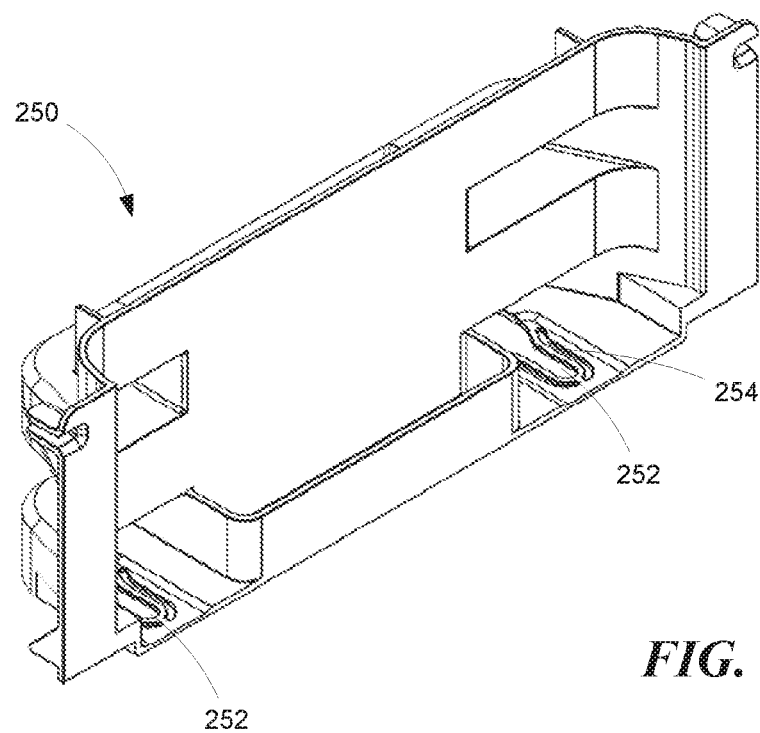
FIG. 7 is an isometric view of an air duct cover as viewed from the front.
Figure 8:
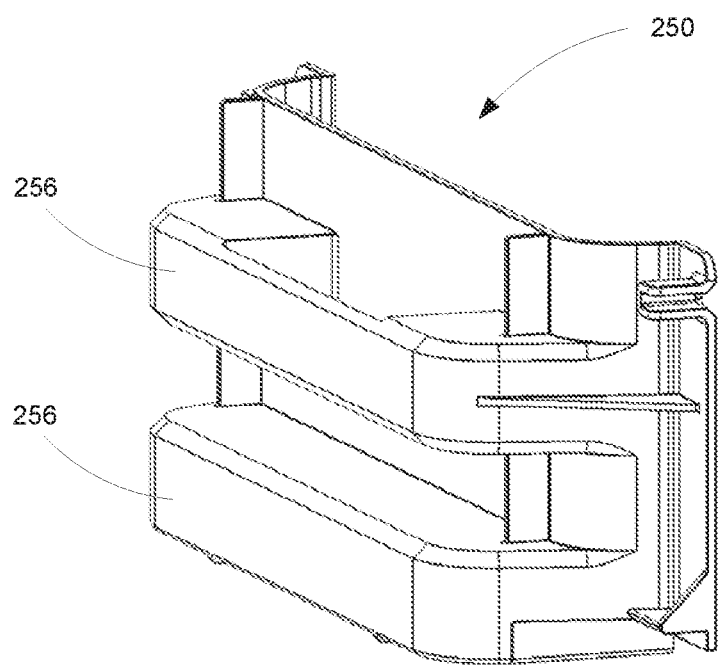
FIG. 8 is an isometric view of the air duct cover of FIG. 7 as viewed from the back.

As can be appreciated in FIG. 6, for example, the components on each server card 300 (e.g., memory 308 and heat sink 306 (FIG. 5)) extend downward into the sled 200 and face bottom wall 204. Accordingly, the second side 305 faces outward and encloses the otherwise open top of the sled chassis 202 in a configuration to facilitate proper airflow through the sled chassis 202. The orientation of the server cards 300 also positions the primary server connectors 220 closer to the sled's network connection 214 (FIG. 4) for improved signal integrity. The server sled 200 includes a sled connector 224 configured to mate with a corresponding cubby connector 126 (FIG. 3), thereby providing power to the server sled 200, including the server cards 300. The server sled 200 also includes air duct covers 250 enclosing the otherwise open side of the sled chassis 202 in order to contain the airflow generated by cooling fans 222 within the server sled 200. Each air duct cover 250 clips onto a pair of cover pins 258. With further reference to FIGS. 7 and 8, the air duct covers 250 include a pair of clips 252 comprising resilient arms 254 configured to slideably engage the cover pins 258 (FIGS. 6). The air duct covers 250 also include a pair of ribs 256 adapted to extend between the latches 304 of adjacent server cards 300 (FIG. 5) in order to direct the air flow from the cooling fans 222 (FIG. 6) across the components of the server cards 300, particularly the heat sinks 306 (FIG. 5). In some embodiments, the air duct covers 250 can comprise molded or thermoformed plastic.

Figure 9:
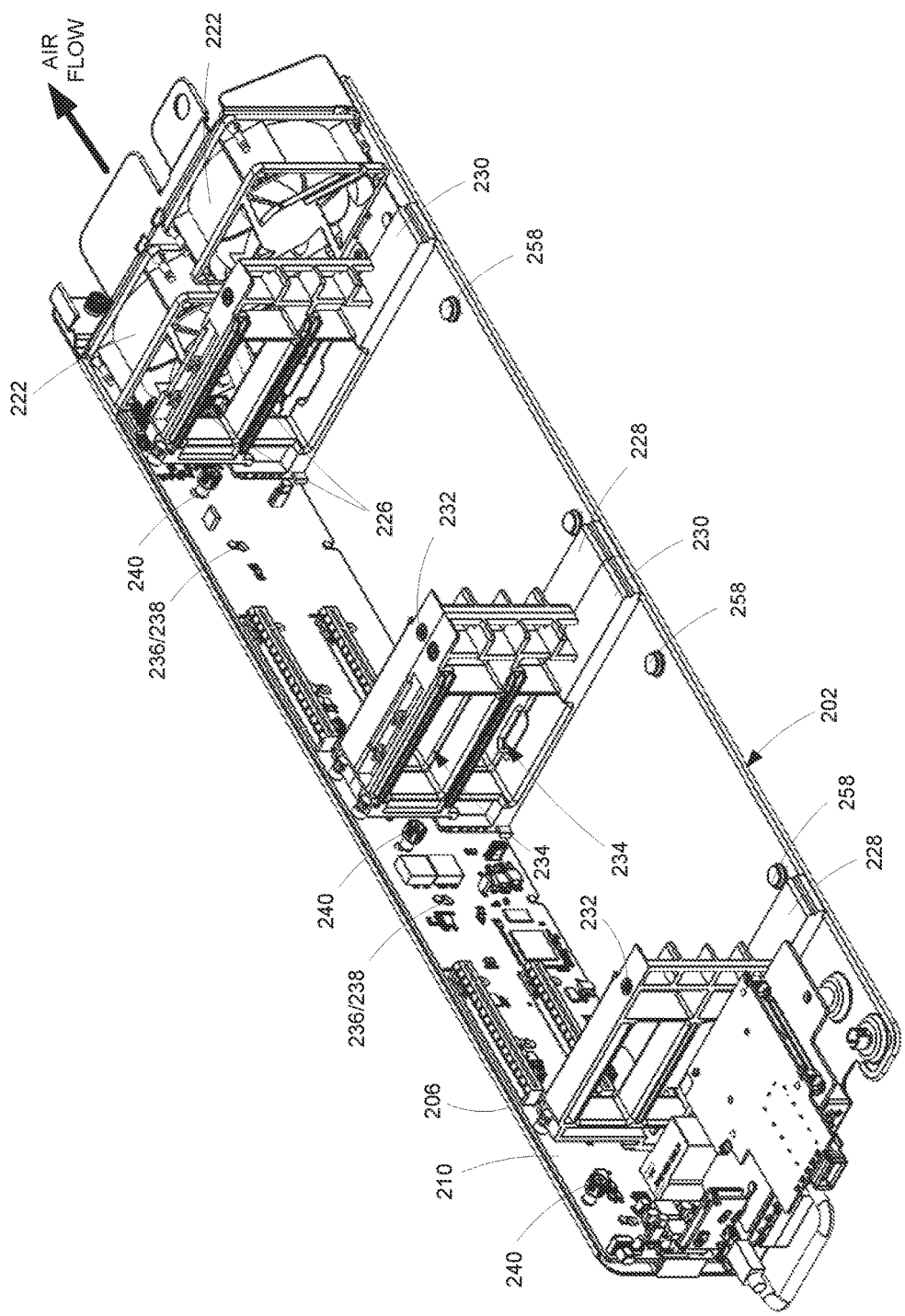
FIG. 9 is an isometric view of the sled of FIG. 4 with the server cards removed.

The server cards 300 are supported by card guides 226, shown in FIG. 9, disposed on left and right side dividers 228 and 230, respectively. The dividers 228 and 230 are mounted to the sled chassis 202 with fasteners 232. In some embodiments, the dividers are plastic and include large air flow openings 234. The side plane PCB 210 is supported on pins 236 extending from side wall 206 through slotted apertures 238 formed through the side plane PCB 210. The side plane PCB 210 is secured in position the side wall 206 with suitable fasteners 240. Thus, the side plane PCB 210 is removable when the fasteners 240 are released (e.g., unscrewed) from the sled chassis 202.

Figure 10:
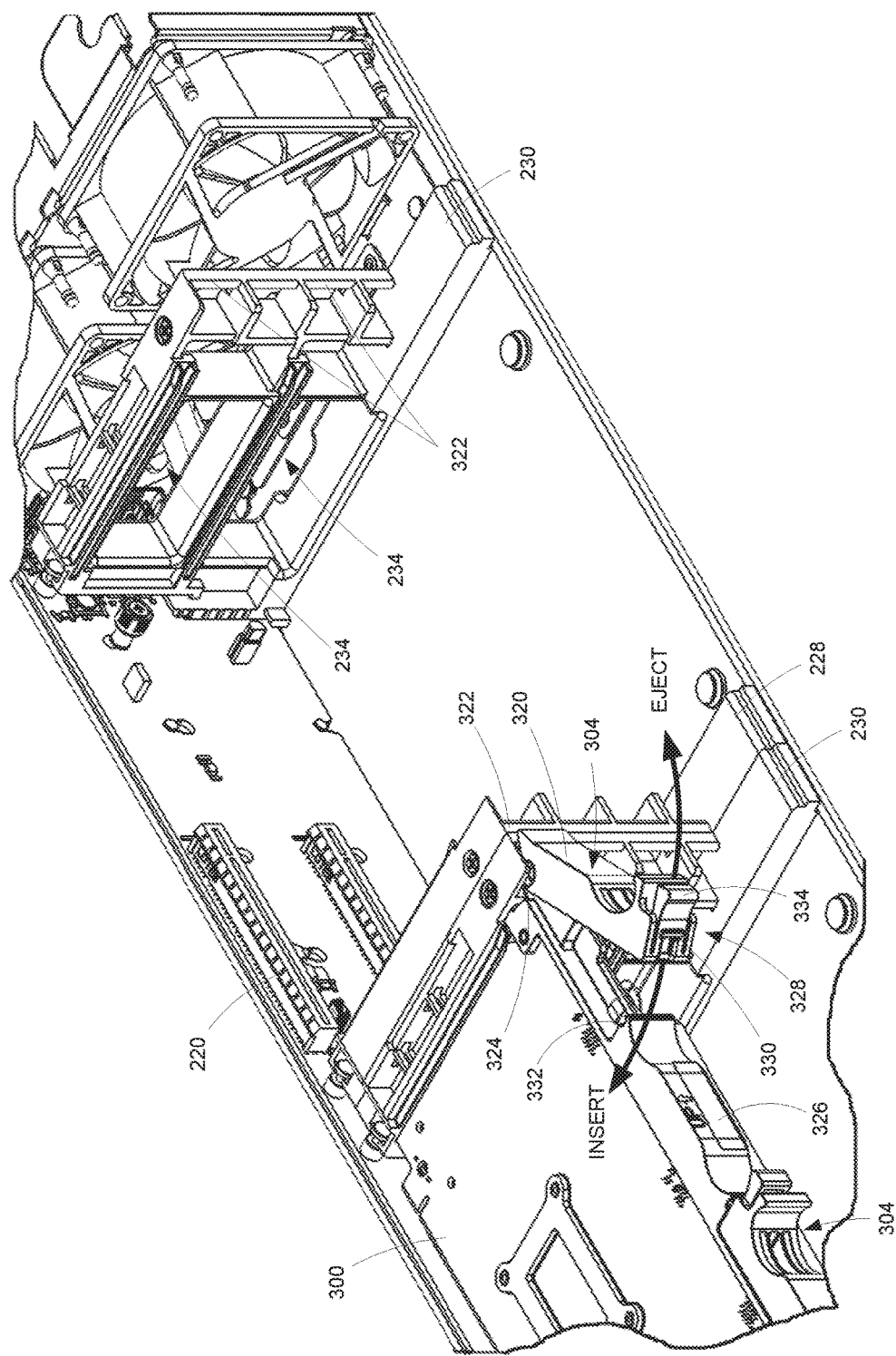
FIG. 10 is a partial, enlarged isometric view of the sled of FIG. 9 illustrating the server card latches.

As shown in FIG. 10, the server cards 300 each include a pair of latches 304. Each latch 304 includes a lever 320 that engages a corresponding keeper 322 formed on the dividers 228 and 230. The levers 320 are pivotally mounted on corresponding lever pins 324 to a cross-member 326 attached to the server card 300. The levers 320 pivot between an insert position and an eject position, between which the server card 300 is levered into and out of a corresponding connector socket 220. Each lever 320 includes a lever lock 328 operative to retain the lever 320 in the insert position. A tooth 330 on the lever lock 328 engages a notch 332 in the cross-member 326 when the levers 320 are positioned in the insert position. A user can depress the release tab 334, thereby disengaging the tooth 330 from the notch 332. In some embodiments, each lever 320 includes a torsion spring or other biasing member mounted on each lever pin 324 or otherwise positioned to urge the corresponding lever 320 toward the eject position. The latches are further described in U.S. patent application Ser. No. 14/704,166, filed May 5, 2015, and titled CIRCUIT BOARD ACTUATOR SYSTEM, the disclosure of which is hereby incorporated by reference in its entirety.

The cubby chassis and sled platform described above with respect to multi-node servers is applicable to graphics processing unit (GPU) cards as well. The multi-GPU sled described below packages multiple GPU cards into a sled in a similar fashion as that described above. Each GPU card uses standard GPU components mounted on a standard peripheral component interconnect (PCI) form factor PCB, which allows for high-density packaging of the GPUs.

Figure 11:
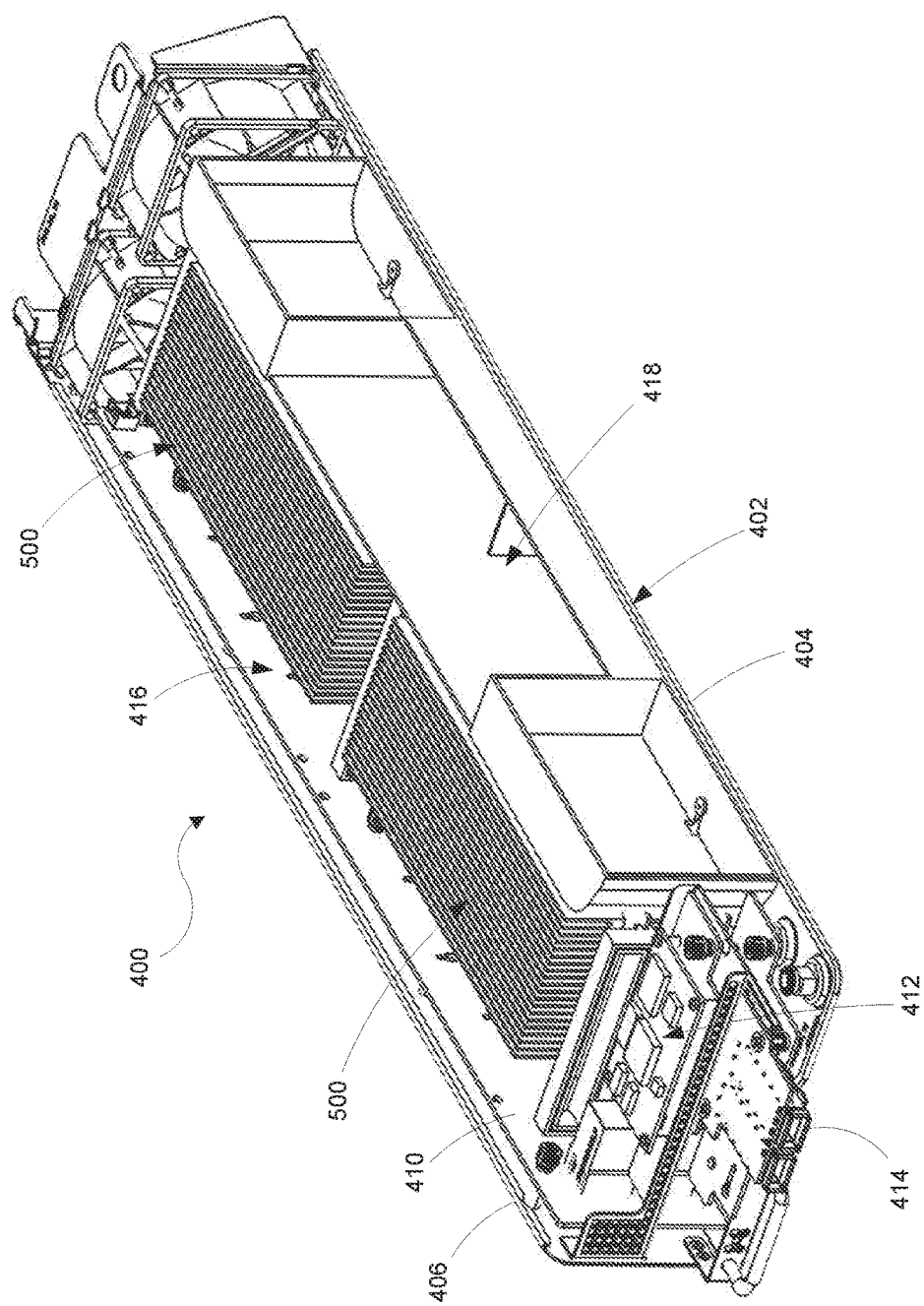
FIG. 11 is an isometric view of a multi-GPU sled according to a representative embodiment.

As shown in FIG. 11, each multi-GPU sled 400 of the illustrated embodiment can house up to four GPU cards 500. The multi-GPU sled 400 includes a sheet metal sled chassis 402 supporting a vertically oriented side plane PCB 410. The GPU cards 500 are inserted horizontally into the multi-GPU sled 400 for operative engagement with the side plane PCB 410 via conventional connectors (e.g., PCI connectors). The illustrated sled chassis 402 has a vertical sidewall 406 and a horizontal bottom wall 404, wherein the sled chassis has an open top 416 and an open side 418 opposite the vertical sidewall 406. Each GPU card 500 is connected via the side plane PCB 410 to a COM Express mini-server 412 and a 100G network interface card 414 located on the front of the multi-GPU sled 400.

Figure 12:
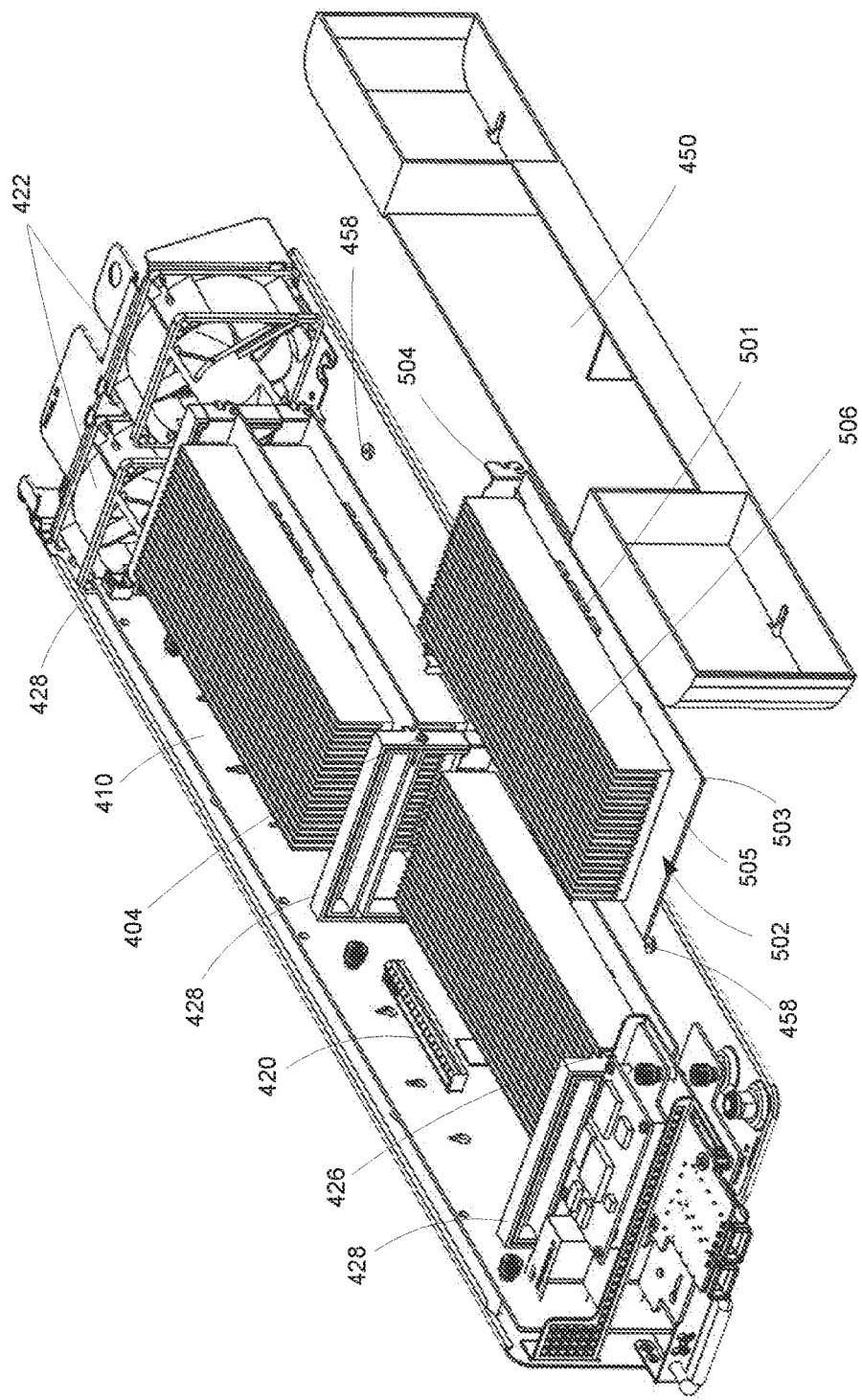
FIG. 12 is a partially exploded isometric view of the multi-GPU sled shown in FIG. 11.

Referring to FIG. 12, each GPU card 500 includes a GPU PCB 502 having a PCI compliant form factor and a standard PCI bracket 504. The GPU PCB 502 has a first side 503 and second side 505. The second side 505 of the GPU PCB 502 supports various GPU components 501 and a corresponding heat sink 506. Each GPU card 500 is connected to a corresponding connector socket 420 mounted on sideplane PCB 410. The GPU cards 500 are supported on one side by card guides 426 disposed on the dividers 428. On the opposite side, each GPU card is attached to a corresponding divider 428 with the PCI bracket 504 using a suitable fastener, such as screw 404.

The GPU sled 400 also includes an air duct cover 450 enclosing the otherwise open side of the sled chassis 402 in order to contain the airflow generated by cooling fans 422 within the GPU sled 400. In some embodiments, the air duct cover 450 clips onto a pair of cover pins 458.

Remarks

The above description, drawings, and appendices are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A multiple graphics processing unit (multi-GPU) platform, comprising:
    a cubby chassis including one or more partitions defining a plurality of sled positions;
    at least one multi-GPU sled located in a corresponding one of the plurality of sled positions, the multi-GPU sled comprising:
        a sled chassis having a sidewall and a bottom wall, wherein the sled chassis has an open top and an open side opposite the sidewall;
        a vertically oriented side-plane printed circuit board (PCB) mounted to the sidewall;
        a plurality of dividers attached to the bottom wall and oriented substantially perpendicular to the side-plane PCB;
        one or more GPU cards connected to the side-plane PCB and supported by a pair of the plurality of dividers, the one or more GPU cards comprising:
            a GPU PCB having a first side facing the bottom wall and an outward facing second side; and
            one or more GPU components coupled to the second side of the GPU PCB; and
        a cover coupled to the horizontal bottom wall and configured to enclose the open side of the sled chassis.

2. The multi-GPU platform of claim 1, wherein the cubby chassis has a power input connector configured to receive power from a component rack, and the cubby chassis has a plurality of cubby connectors corresponding to each of the plurality of sled positions connected to the power connector, and wherein the at least one multi-GPU sled includes a sled connector mated with a corresponding one of the plurality of cubby connectors.

3. The multi-GPU platform of claim 1, further comprising one or more fans coupled to the sled chassis operative to move air through the multi-GPU sled.

4. The multi-GPU platform of claim 3, wherein each of the plurality of dividers includes airflow openings through which the one or more fans move air.

5. The multi-GPU platform of claim 1, wherein each of the plurality of dividers includes two card guide slots.

6. The multi-GPU platform of claim 1, wherein the one or more GPU cards includes a peripheral component interconnect (PCI) bracket.

7. A multi-GPU platform for use with a component rack, comprising:
   a cubby chassis configured for mounting in the component rack;
   a plurality of multi-GPU sleds housed in the cubby chassis, selected ones of the multi-GPU sleds comprising:
       a sled chassis having a sidewall and a bottom wall;
       a side-plane printed circuit board (PCB) mounted to the sidewall in a substantially parallel orientation;
       a plurality of dividers attached to the bottom wall and oriented substantially perpendicular to the side-plane PCB;
       one or more GPU cards connected to the side-plane PCB and supported by a pair of the plurality of dividers, the one or more GPU cards comprising:
           a GPU PCB having an outward facing component side; and
           one or more GPU components coupled to the component side of the GPU PCB; and
       one or more covers extending away from the bottom wall to enclose the one or more GPU cards between the side-plane PCB and the one or more covers.

8. The multi-GPU platform of claim 7, wherein the cubby chassis includes a power input connector and a plurality of cubby connectors connected to the power input connector, and wherein each of the plurality of multi-GPU sleds includes a sled connector mated with a corresponding one of the plurality of cubby connectors.

9. The multi-GPU platform of claim 7, wherein each of the plurality of multi-GPU sleds further comprises one or more fans positioned to move air through the multi-GPU sled.

10. The multi-GPU platform of claim 9, wherein each of the plurality of dividers includes airflow openings through which the one or more fans move air.

11. The multi-GPU platform of claim 7, wherein each of the plurality of dividers includes two or more card guide slots.

12. The multi-GPU platform of claim 7, wherein the one or more GPU cards includes a PCI bracket.

13. The multi-GPU platform of claim 7, wherein each one of the plurality of multi-GPU sleds is removable from the cubby chassis independent of the other ones of the plurality of multi-GPU sleds.

14. A multi-GPU sled for use in a cubby chassis, the multi-GPU sled comprising:
    a sled chassis having a vertical sidewall and a horizontal bottom wall, wherein the sled chassis has an open top and an open side opposite the vertical sidewall;
    a vertically oriented side-plane printed circuit board (PCB) mounted to the vertical sidewall;
    a plurality of dividers attached to the bottom wall and oriented substantially perpendicular to the side-plane PCB; and
    one or more GPU cards connected to the side-plane PCB and horizontally supported by a pair of the plurality of dividers, the one or more GPU cards comprising:
        a GPU PCB having a first side facing the bottom wall and an outward facing second side; and
        one or more GPU components coupled to the second side of the GPU PCB.

15. The multi-GPU sled of claim 14, further comprising one or more fans positioned at an end of the sled chassis operative to draw air through the multi-GPU sled.

16. The multi-GPU sled of claim 15, wherein each of the plurality of dividers includes airflow openings through which the one or more fans draw air.

17. The multi-GPU sled of claim 14, wherein each of the plurality of dividers includes two or more card guide slots.

18. The multi-GPU sled of claim 14, wherein the one or more GPU cards includes a PCI bracket.

* * * * *